United States Patent [19]
Ikeda

[11] Patent Number: 6,097,107
[45] Date of Patent: Aug. 1, 2000

[54] SHORT PREVENTION CONTROL APPARATUS OF AIR CONDITIONER FOR ELECTRIC VEHICLES

[75] Inventor: Hideo Ikeda, Isesaki, Japan

[73] Assignee: Sanden Corporation, Gunma, Japan

[21] Appl. No.: 09/170,205

[22] Filed: Oct. 13, 1998

[30] Foreign Application Priority Data

Oct. 17, 1997 [JP] Japan ................................ 9-285792

[51] Int. Cl.[7] .................................................. H02H 7/08
[52] U.S. Cl. ...................... 307/10.7; 307/9.1; 307/10.1; 361/22; 361/23
[58] Field of Search ................................. 307/9.1, 10.1, 307/10.7; 62/228.1, 239, 243; 361/23, 31, 22, 115; 318/139

[56] References Cited

U.S. PATENT DOCUMENTS

| | | | |
|---|---|---|---|
| 5,275,012 | 1/1994 | Dage et al. | 62/228.1 |
| 5,408,842 | 4/1995 | Goto et al. | 62/243 |
| 5,418,676 | 5/1995 | Murakami et al. | 361/23 |
| 5,684,463 | 11/1997 | Diercks et al. | 340/584 |

FOREIGN PATENT DOCUMENTS

| | | |
|---|---|---|
| 6-2901 | 1/1994 | Japan . |
| 7-241002 | 9/1995 | Japan . |

*Primary Examiner*—Albert W. Paladini
*Attorney, Agent, or Firm*—Baker Botts L.L.P.

[57] ABSTRACT

A short prevention control apparatus of an air conditioner for electric vehicles comprises a circuit breaker for a high voltage power source used to drive a compressor of the air conditioner, a drive circuit for driving a compressor motor and a short detecting circuit connected between a coupling wire and ground, wherein the wire connects the circuit breaker and the drive circuit. The short detecting circuit detects a short at a position between ground and a polar bus terminal of the drive circuit or an internal terminal of the compressor motor, when supply of a high voltage direct current is interrupted by the circuit breaker. A short in the air compressor side may be detected and determined without affecting the running of the electric vehicle.

9 Claims, 2 Drawing Sheets

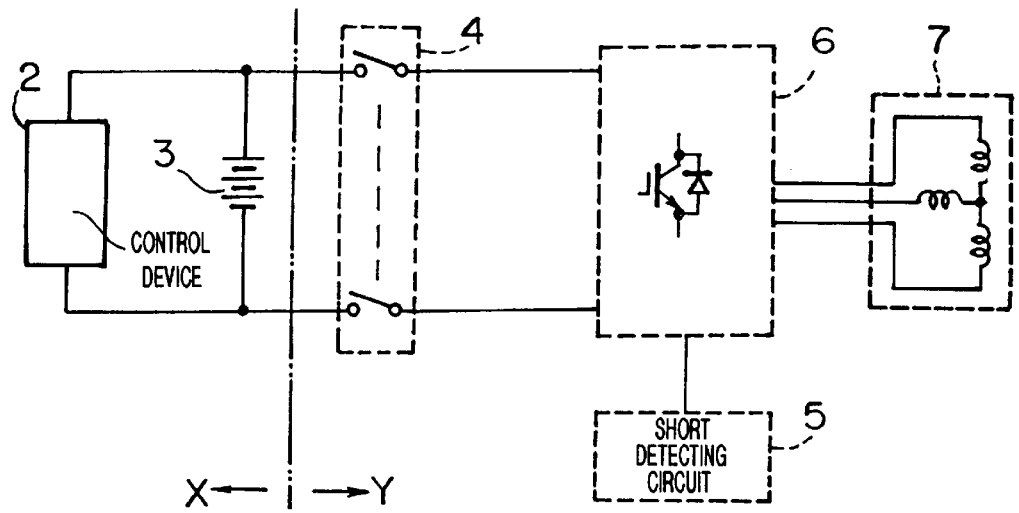
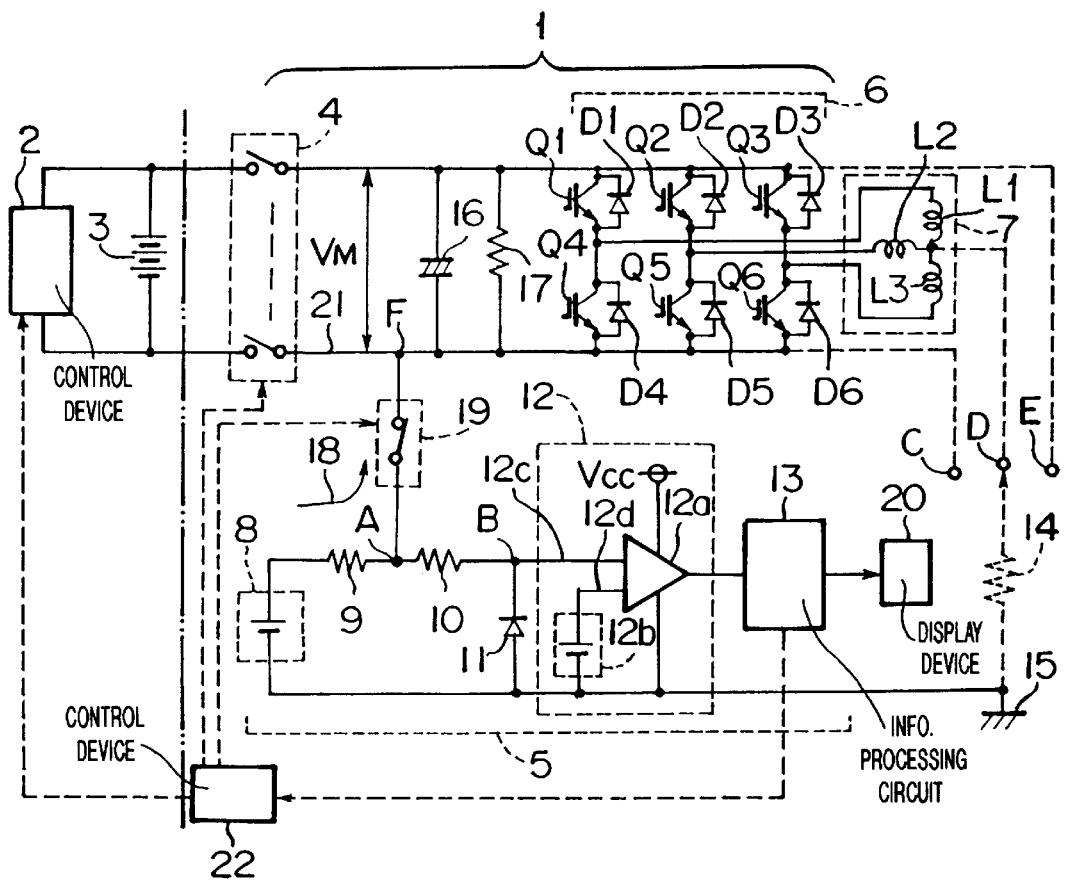

SHORT PREVENTION CONTROL APPARATUS OF AIR CONDITIONER FOR ELECTRIC VEHICLES

BACKGROUND OF THE INVENTION

1. Field of the Invention

The present invention relates to a short prevention control apparatus of an air conditioner for an electric vehicle, and, more specifically, to a short prevention control apparatus efficiently detecting a short in a circuit for the air conditioner and adequately breaking a circuit for the air conditioner without affecting the running of the electric vehicle.

2. Description of the Related Art

Technologies relating to detection of a short for electric vehicles, for example, a technology disclosed in Japanese Utility Model Laid Open HEI 6-2901 and a technology disclosed in JP-A-HEI 7-241002, are known.

In the former short detection apparatus for electric vehicles, a short generated between a sink and a battery (a high voltage power source) for the electric vehicle running is detected by detecting a voltage difference caused by a current flowing through a short detecting resistor, and the result of the detection is informed to an electric vehicle driver. In the latter short detection apparatus for electric vehicles, an inverter for driving a motor (for example, alternating current motor) for running the electric vehicle comprises a pair of groups of switching elements. A short in the motor is detected at an input side of the inverter by forcibly controlling one group of switching elements to be on and the other group of switching elements to be off.

When an air conditioner is mounted on such an electric vehicle, usually, a high voltage power source for running of the electric vehicle (for example, a 300 V type high voltage, direct current power source) is used for driving a compressor (a compressor motor) of the air conditioner, and a low voltage power source (for example, a 12 V type low voltage, direct current power source) is used for controlling a driving device for the motor (for example, an inverter).

In electric vehicles, generally, a short detecting circuit is provided in a running control apparatus applied with a high voltage to prevent an electric shock accident due to a short. Usually, such a short detecting circuit may detect a short at any portion of a high voltage circuit.

However, in any type of the above-described known short detection apparatus for electric vehicles, because a short is detected without distinguishing between a running apparatus side and an air conditioner side, even when a short occurs only in the air conditioner, the location cannot be determined. Therefore, when the short is only in the air conditioner, any short prevention also affects the running of the electric vehicle.

SUMMARY OF THE INVENTION

Accordingly, it is an object of the present invention to provide a short prevention control apparatus of an air conditioner for an electric vehicle, which may detect a short individually for the air conditioner without affecting the running of the electric vehicle while adequately preventing occurrence of an electric shock due to the short.

To achieve the foregoing and other objects, a short prevention control apparatus of an air conditioner for electric vehicles according to the present invention is provided. The short prevention control apparatus of an air conditioner for electric vehicles according to the present invention comprises a circuit breaker for breaking a high voltage direct current supplied from a high voltage power source to a compressor of an air conditioner mounted in an electric vehicle, a drive circuit supplied with the high voltage direct current for driving the compressor, a compressor motor connected to the drive circuit, and a short detecting circuit connected between a coupling wire and ground, wherein the wire connects the circuit breaker and the drive circuit. The short detecting circuit detects a short at a position between ground and a polar bus terminal of the drive circuit or an internal terminal of the compressor motor, when supply of the high voltage direct current is interrupted, example, stopped, by the circuit breaker.

In the short prevention control apparatus, the short detecting circuit may comprise a low voltage power source and a short detecting resistor supplied with a low voltage direct current from the low voltage power source. The short detecting circuit detects a short in accordance with a detected current flowing through the short detecting resistor, when the low voltage direct current is supplied to the short detecting resistor.

In such a short prevention control apparatus, a negative electrode of the low voltage power source may be connected to ground, and a positive electrode of the low voltage power source may be connected to the short detecting resistor. Further, the short detecting circuit may include a voltage determination circuit. The voltage determination circuit generates a short detecting signal indicating a result of a comparison between a reference voltage and a voltage that varies depending on the detected current at a position of a first junction that is formed between a negative input side of the drive circuit and an output side of the short detecting resistor. Moreover, the short detecting circuit may include an information processing circuit for processing information on the short detecting signal. The short prevention control apparatus also may include a display device capable of displaying information on the short detecting signal.

In the short prevention control apparatus, the short detecting circuit further may include a protective resistor connected to the first junction and a protective diode whose positive side is connected to ground. Further, a second junction that is formed between an output side of the protective resistor and a negative side of the protective diode, may be connected to an input terminal of the voltage determination circuit, inputting a voltage that varies depending on the detected current into the voltage determination circuit.

In addition, in the short prevention control apparatus, the short detecting circuit may include a switch provided between the negative input side of the drive circuit and the output side of the short detecting resistor. The switch controls supply of the detected current, and the switch may be opened when the high voltage direct current is supplied through the circuit breaker and closed when the high voltage direct current is interrupted, for example, stopped, by the circuit breaker.

In the short prevention control apparatus, the short detecting circuit further may include a control device for automatically switching the circuit breaker and the switch. The control device may be controlled, such that initially the circuit breaker is opened to interrupt, for example, stop, supply of the high voltage direct current and the switch is closed to detect a short by the short detecting signal from the voltage determination circuit, and further wherein the switching of the circuit breaker and the switch is based on the information on the short detecting signal from the information processing circuit. The control device may send the information on the short detecting signal from the information processing circuit to a running control device that controls the running of the electric vehicle.

In such a short prevention control apparatus according to the present invention, at a state substantially separating the air conditioner from the control device that controls the running of the electric vehicle, a short that is only within the air conditioner may be detected individually without affecting the control device for running the electric vehicle. Therefore, if a short is generated only in the air conditioner, occurrence of an electric shock may be easily and appropriately prevented by only stopping use of the air conditioner, while not affecting the running of the electric vehicle.

Further objects, features, and advantages of the present invention will be understood from the following detailed description of the preferred embodiment of the present invention with reference to the accompanying figure.

BRIEF DESCRIPTION OF THE DRAWINGS

A preferred embodiment of the invention is now described with reference to the accompanying figures, which is given by way of example only, and is not intended to limit the present invention.

FIG. 1 is a schematic block diagram of a short prevention control apparatus of an air conditioner for electric vehicles according to an embodiment of the present invention.

FIG. 2 is a circuit diagram of the apparatus depicted in FIG. 1.

DETAILED DESCRIPTION OF THE PREFERRED EMBODIMENT

Figure 3:
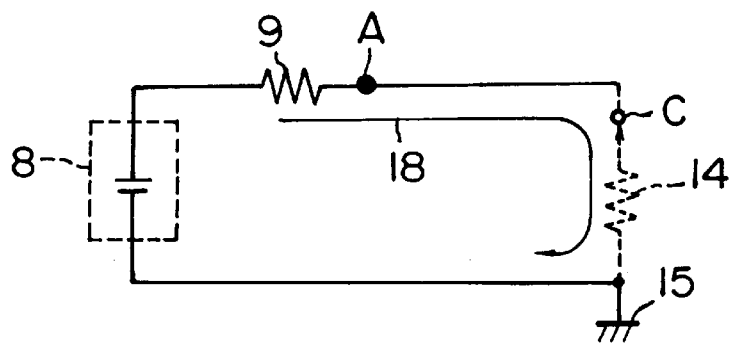
FIG. 3 is a partial circuit diagram of the apparatus depicted in FIG. 2.

FIG. 1 is a block diagram showing an embodiment of a short prevention control apparatus of an air conditioner for electric vehicles according to the present invention. FIG. 2 is a circuit diagram showing the details of the apparatus depicted in FIG. 1. The short prevention control apparatus includes a circuit breaker 4, a drive circuit 6, and a short detecting circuit 5. Circuit breaker 4 breaks a high voltage direct current supplied from a high voltage power source 3 to a compressor of an air conditioner mounted in an electric vehicle. The compressor is driven by a compressor motor 7. Drive circuit 6 is constructed from an inverter in this embodiment. The high voltage direct current from high voltage power source 3 is supplied to inverter 6, and inverter 6 drives compressor motor 7. The high voltage direct current from high voltage power source 3 also is supplied to a running control device 2 for controlling running of the electric vehicle. In FIG. 1, area X shows a running control side and area Y shows an air conditioner side.

In FIG. 2, short detecting circuit 5 is connected between a coupling wire 21 and ground, wherein the wire connects circuit breaker 4 and inverter 6. Short detecting circuit 5 detects a short at a position between ground 15 and a polar bus terminal C or E of inverter 6 or an internal terminal D of compressor motor 7, via a short resistance 14, when supply of the high voltage direct current is interrupted, for example, stopped, by the opening of circuit breaker 4. Internal terminal D of compressor motor 7 is connected to a junction of three coils L1, L2, and L3 of compressor motor 7. Circuit breaker 4 and inverter 6 control the driving compressor motor 7 (compressor), and constitute a part of control system 1 for the air conditioner.

In the short prevention control apparatus, a short in the air conditioner side is detected when the operation of running control device 2 for controlling the running of the electric vehicle and the air conditioner control system 1 are interrupted from each other, regardless of the state of a short detecting circuit (not shown) provided in running control device 2. Namely, a short in the air conditioner side is detected when the input voltage $V_M$ to inverter 6 is about 0 V.

Short detecting circuit 5 has a low voltage direct current power source 8 for controlling inverter 6, and a short detecting resistor 9 supplied by the low voltage direct current from low voltage power source 8. Short detecting circuit 5 detects a short in accordance with the degree of a detected current 18 flowing through short detecting resistor 9, when the low voltage direct current is supplied to short detecting resistor 9. The negative electrode side of low voltage power source 8 is connected to ground 15, and the positive electrode side thereof is connected to short detecting resistor 9. Short detecting circuit 5 includes a voltage determination circuit 12 and an information processing circuit 13. Voltage determination circuit 12 generates a short detecting signal indicating a result of a comparison between a reference voltage and a voltage that varies depending on the detected current 18 at a first junction A that is formed at a connection between a negative input side of inverter 6 and an output side of short detecting resistor 9.

In this embodiment, short detecting circuit 5 further has a protective resistor 10 connected to first junction A and a protective diode 11 whose positive side is connected to ground 15. An output side of protective resistor 10 and a negative side of protective diode 11 are connected to form a second junction B. Second junction B is connected to an input terminal 12c of voltage determination circuit 12 for inputting the voltage that varies depending on the detected current 18 into voltage determination circuit 12.

Information processing circuit 13 receives the short detecting signal from voltage determination circuit 12 and processes the information on the short detecting signal. In this embodiment, the information on the short detecting signal may be displayed by a display device 20 connected to information processing circuit 13.

In voltage determination circuit 12, one input terminal of a comparator 12a is connected to detected voltage input terminal 12c, and the other input terminal of the comparator 12a is connected to a reference voltage input terminal 12d. A reference voltage power source 12b generates a reference voltage Vcc (12 V), and reference voltage power source 12b is connected to reference voltage input terminal 12d. In comparator 12a of voltage determination circuit 12, the detected voltage generated depends on the detected current 18 that is input by detected voltage input terminal 12c in comparison with reference voltage Vcc (12 V) input by reference voltage input terminal 12d from reference voltage power source 12b. The result of the comparison by comparator 12a is output to information processing circuit 13 as a short detecting signal. Information processing circuit 13 determines a short when short resistance 14 becomes lower than a predetermined value by occurrence of a short.

In the short prevention control apparatus, as short resistance 14 becomes lower, a short current due to the high voltage direct current, supplied from high voltage power source 3 when two switches of circuit breaker 4 are closed, becomes greater.

A resistor having a high resistance value, such as a value of several MΩ, is used for short detecting resistor 9. If when circuit breaker 4 is closed to apply the high voltage direct current to operate the air conditioner, and the resistance value of short detecting resistor 9 is low, a short current flows to running control device 2 through low voltage power source 8 and a short detecting circuit in running control device 2 may operate. Such an inconvenience may be prevented by setting the resistance value of short detecting resistor 9 at a high value, such as a value of several MΩ.

Protective resistor 10 prevents a short. In the case where a short is generated in the positive bus when circuit breaker 4 is closed, if protective resistor 10 is not present (namely, the resistance is equal to zero at this portion), high voltage power source 3 is in a short condition through protective diode 11. This is prevented by protective resistor 10 having a high resistance value of several M Ω. Protective diode 11 prevents a breakage of voltage determination circuit 12 when a high voltage is applied between reference voltage input terminal 12d and detected voltage input terminal 12c of voltage determination circuit 12.

Further, in the short prevention control apparatus of this embodiment, short detecting circuit 5 includes a switch 19 provided between the negative input side of inverter 6 and the output side of short detecting resistor 9. Switch 19 controls the supply of detected current 18. Switch 19 is opened when the high voltage direct current is supplied by the closing of circuit breaker 4 and switch 19 is closed when supply of the high voltage direct current is interrupted, for example, stopped, by the opening of circuit breaker 4. Switch 19 prevents unnecessary operation of a short detecting circuit provided in running control device 2 by preventing flow of current through short detecting resistor 9.

In this embodiment, the short prevention control apparatus further includes a control device 22 for automatically switching circuit breaker 4 and switch 19. Initially, control device 22 opens circuit breaker 4 to interrupt, for example, stop, supply of the high voltage direct current and closes switch 19 to detect a short by the short detecting signal from voltage determination circuit 12. Control device 22 controls the switching of circuit breaker 4 and switch 19 based on the information on the short detecting signal from information processing circuit 13. Further, control device 22 may send the information on the short detecting signal from information processing circuit 13 to running control device 2 for controlling running of the electric vehicle.

The circuit shown in FIG. 2 includes other elements for the air conditioner. Two switches of circuit breaker 4 are connected to a positive bus and a negative bus of inverter 6, respectively. A high voltage direct current due to a high voltage "$V_M$" (for example, about 300 V) from power source 3 is supplied to inverter 6 by closing two switches of circuit breaker 4. Between the positive bus and the negative bus of the input side of inverter 6, a capacitor 16 and discharge resistor 17 for discharging an electric charge in capacitor 16, are provided.

Inverter 6 comprises three switching elements Q1–Q3 and circulating current diodes D1–D3 connected to the positive bus and three switching elements Q4–Q6 and circulating current diodes D4–D6 connected to the negative bus. Switching element Q1 and diode D1 are coupled in parallel to each other and switching element Q4 and diode D4 are coupled in parallel to each other. Switching element Q2 and diode D2 are coupled in parallel to each other and switching element Q5 and diode D5 are coupled in parallel to each other. Also, switching element Q3 and diode D3 are coupled in parallel to each other and switching element Q6 and diode D6 are coupled in parallel to each other. Coupled switching element Q1 and diode D1 and coupled switching element Q4 and diode D4 have a wire between them, coupled switching element Q2 and diode D2 and coupled switching element Q5 and diode D5 have a wire between them, and coupled switching element Q3 and diode D3 and coupled switching element Q6 and diode D6 have a wire between them, respectively. The wires between Q1, D1 and Q4, D4; between Q2, D2 and Q5, D5; and between Q3, D3 and Q6, D6 are connected to motor coils L1–L3 of compressor motor 7, respectively, to supply three-phase alternating current to compressor motor 7.

In such a short prevention control apparatus, a short is detected as follows. Control device 22 initially turns circuit breaker 4 off and switch 19 on to supply the low voltage direct current from low voltage power source 8 to inverter 6 through short detecting resistor 9. Detected current 18 flowing through short detecting resistor 9 is supplied to inverter 6 through junction F of the negative bus of inverter 6.

If a short is generated in the air conditioner from inverter 6 or compressor motor 7, a short resistance 14 may be generated through any one of polar bus terminals C and E of inverter 6 or through internal terminal D of compressor motor 7. When detected current 18 passes through short resistance 14 and is fed back to low voltage power source 8 after again passing through short detecting resistor 9 and protective resistor 10, voltage determination circuit 12 may detect a short based on the voltage that varies in accordance with the detected current 18 at junction A, that is, in accordance with a variation of partial voltage.

FIG. 3 is a partial circuit diagram of the circuit depicted in FIG. 2 for explaining a short detection through negative bus terminal C (determination of short resistance of negative bus). When a short is generated in the negative bus, detected current 18 flows from the positive side of low voltage power source 8 to the negative side thereof through negative bus terminal C and short resistance 14. The short is determined as described above.

In the short prevention control apparatus, because the negative side of low voltage power source 8 is connected to ground 15, diodes D1–D6 of inverter 6 or motor coils L1–L3 of compressor motor 7 have no effect. However, when touched between the positive side of high voltage power source 3 and a person, electric shock may occur. In such a case, use of the air conditioner may be stopped or prevented from actuating, by turning circuit breaker 4 off.

Figure 4:
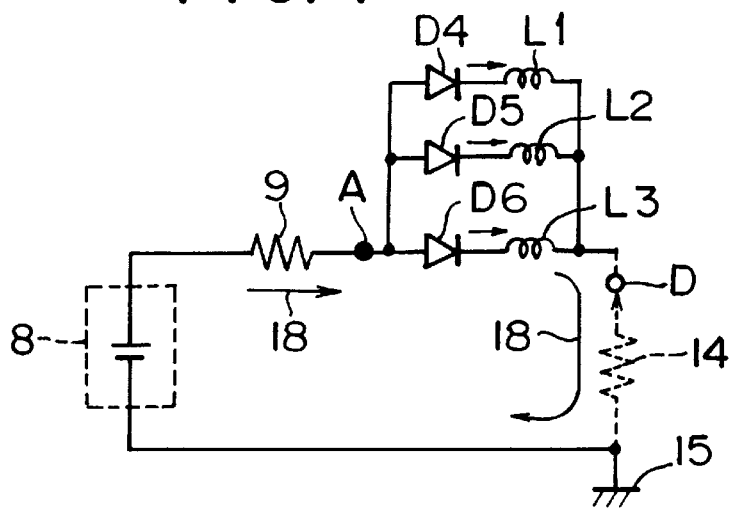
FIG. 4 is yet another partial circuit diagram of the apparatus depicted in FIG. 2.

FIG. 4 is a partial circuit diagram of the circuit depicted in FIG. 2 for explaining a short detection through internal terminal D of compressor motor 7 (determination of leak resistance in compressor motor). When a short occurs in compressor motor 7 or a compressor, detected current 18 is fed back to short detecting resistor 9 through internal terminal D of compressor motor 7 and short resistance 14. The short is determined as stated above. Although voltages are generated between both ends of diodes D4–D6 and between both ends of motor coils L1–L3, these voltages are sufficiently small as compared to the voltage generated between short detecting resistor 9 and short resistance 14, and therefore, may be ignored.

Figure 5:
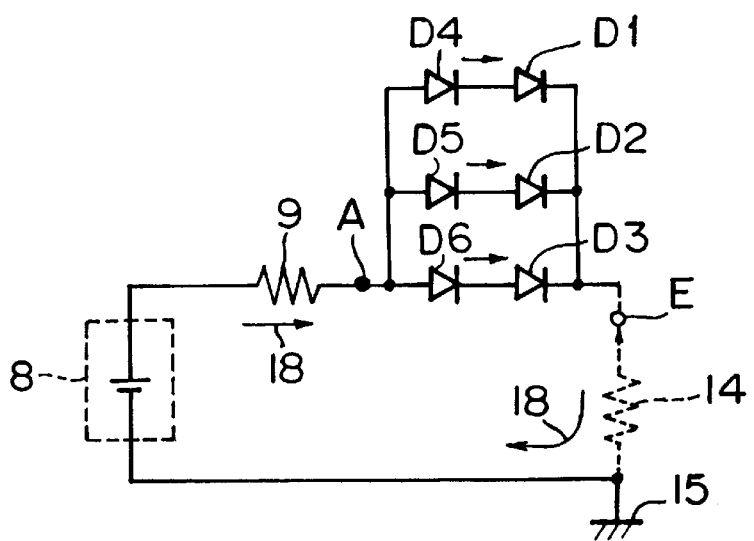
Fig. 5 is still another partial circuit diagram of the apparatus depicted in FIG. 2.

FIG. 5 is a partial circuit diagram of the circuit depicted in FIG. 2 for explaining a short detection through positive bus terminal E (determination of short resistance of positive bus). When a short occurs in the positive bus, detected current 18 is fed back to short detecting resistor 9 through positive bus terminal E and leak resistance 14. The short is determined as stated above. Although voltages are generated between both ends of diodes D1–D6, these voltages are sufficiently small as compared to the voltage generated between short detecting resistor 9 and short resistance 14, and therefore, may be ignored. Thus, a short in the air conditioner side is detected and determined without detection of a short in the side of running control device 2.

Further, if a short is generated in the air conditioner side, control device 22 automatically turns off circuit breaker 4 and switch 19 to stop or prevent use of the air conditioner. In particular, an appropriate control signal may be sent to circuit breaker 4 and switch 19. Further, appropriate information may also be sent from control device 22 to running control device 2. With this control, when a short only occurs in the air conditioner side, the running control of the electric vehicle is not affected.

Although circuit breaker 4 comprises two switches in the embodiment, because this device may have a function for connection/disconnection of supply route of the high voltage direct current from high voltage power source 3, other devices such as a relay and switching elements may be provided instead of circuit breaker 4.

Although only one embodiment of the present invention has been described in detail herein, the scope of the invention is not limited thereto. It will be appreciated by those skilled in the art that various modifications may be made without departing from the scope of the invention. Accordingly, the embodiment disclosed herein is only exemplary. It is to be understood that the scope of the invention is not to be limited thereby, but is to be determined by the claims which follow.

What is claimed is:

1. A short prevention control apparatus of an air conditioner for electric vehicles comprising:

a circuit breaker for breaking a high voltage direct current supplied from a high voltage power source to a compressor of an air conditioner mounted in an electric vehicle;

a drive circuit connected to said circuit breaker, said drive circuit supplied with said high voltage direct current for driving said compressor;

a compressor motor connected to said drive circuit; and a short detecting circuit connected between a coupling wire and ground wherein said coupling wire connects said circuit breaker and said drive circuit.

2. The short prevention control apparatus according to claim 1 wherein said short detecting circuit detects a short a short at a position between ground and a second position, said second position is a polar bus terminal of said drive circuit or an internal terminal of said compressor motor, when supply of said high voltage direct current is interrupted by said circuit breaker.

3. The short prevention control apparatus according to claim 1, wherein said short detecting circuit comprises a low voltage power source and a short detecting resistor supplied with a low voltage direct current from said low voltage power source, and said short detecting circuit detects a short in accordance with a detected current flowing through said short detecting resistor when said low voltage direct current is supplied to said short detecting resistor.

4. The short prevention control apparatus according to claim 3, wherein a negative electrode of said low voltage power source is connected to ground and a positive electrode of said low voltage power source is connected to said short detecting resistor, and said short detecting circuit includes a voltage determination circuit, which outputs a short detecting signal indicating a result of a comparison between a reference voltage and a voltage that varies depending on said detected current at a position of a first junction that is formed between a negative input side of said drive circuit and an output side of said short detecting resistor, and said apparatus further comprises an information processing circuit for processing information on said short detecting signal.

5. The short prevention control apparatus according to claim 4, wherein said short prevention control apparatus further comprises a display device capable of displaying said information on said short detecting signal.

6. The short prevention control apparatus according to claim 4, wherein said short detecting circuit further comprises a protective resistor connected to said first junction and a protective diode, wherein a positive side of said diode is connected to ground, and wherein a second junction that is formed between an output side of said protective resistor and a negative side of said protective diode is connected to an input terminal of said voltage determination circuit, inputting a voltage that varies depending on said detected current into said voltage determination circuit.

7. The short prevention control apparatus according to claim 4, wherein said short detecting circuit further comprises a switch provided between said negative input side of said drive circuit and said output side of said short detecting resistor, wherein said switch controls supply of said detected current, and said switch is opened when said high voltage direct current is supplied through said circuit breaker, and wherein said switch is closed when supply of said high voltage direct current is interrupted by said circuit breaker.

8. The short prevention control apparatus according to claim 7, wherein said short prevention control apparatus further comprises a control device for automatically switching said circuit breaker and said switch, wherein initially said control device opens said circuit breaker to interrupt supply of said high voltage direct current and closes said switch to detect a short by said short detecting signal from said voltage determination circuit, and further wherein said switching of said circuit breaker and said switch is based on said information on said short detecting signal from said information processing circuit.

9. The short prevention control apparatus according to claim 8, wherein said control device sends said information on said short detecting signal from said information processing circuit to a running control device that controls running of said electric vehicle.

* * * * *